(12) United States Patent
Parida et al.

(10) Patent No.: US 8,738,679 B2
(45) Date of Patent: May 27, 2014

(54) OFFSET-FREE SINC INTERPOLATOR AND RELATED METHODS

(75) Inventors: Rakhel Kumar Parida, Greater Noida (IN); Ankur Bal, Greater Noida (IN); Anupam Jain, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 996 days.

(21) Appl. No.: 12/565,596

(22) Filed: Sep. 23, 2009

(65) Prior Publication Data

US 2011/0004647 A1 Jan. 6, 2011

(30) Foreign Application Priority Data

Jul. 3, 2009 (IN) .......................... 1371/DEL/2009

(51) Int. Cl.
*G06F 17/17* (2006.01)
*H03H 17/06* (2006.01)

(52) U.S. Cl.
CPC ................................. *H03H 17/0664* (2013.01)
USPC ....................................................... 708/313

(58) Field of Classification Search
None
See application file for complete search history.

(56) References Cited

U.S. PATENT DOCUMENTS

| | | | |
|---|---|---|---|
| 5,043,933 A * | 8/1991 | Boutaud et al. | 708/313 |
| 5,298,979 A * | 3/1994 | Kim | 348/655 |
| 6,788,233 B1 * | 9/2004 | Quiquempoix et al. | 341/143 |
| 2002/0034272 A1 * | 3/2002 | Freidhof et al. | 375/350 |
| 2004/0090355 A1 * | 5/2004 | Mayes | 341/143 |
| 2004/0104876 A1 * | 6/2004 | Takeda et al. | 345/87 |
| 2006/0272382 A1 * | 12/2006 | Pitz et al. | 73/1.01 |
| 2007/0124138 A1 * | 5/2007 | Lamblin et al. | 704/212 |

* cited by examiner

*Primary Examiner* — Henry Tsai
*Assistant Examiner* — Aurangzeb Hassan
(74) *Attorney, Agent, or Firm* — Hogan Lovells US LLP

(57) ABSTRACT

An offset free sinc interpolating filter includes differentiators operating at a first sampling frequency, integrators operating at a second sampling frequency and one or more coefficient multipliers. The coefficient multipliers multiply a received value with a constant coefficient value to generate an output value. The differentiators, integrators and coefficient multipliers can be operatively coupled to each other, either directly or through other components such as adders and delay elements, or by a combination of the two. In operation, an input signal is provided to the sinc interpolating filter at the first sampling frequency. The input signal is processed by the differentiators, integrators and coefficient multipliers to generate an output signal at the second sampling frequency. Once the output signal is generated, the integrators are reset before the next input cycle begins.

20 Claims, 10 Drawing Sheets

OFFSET FREE SINC INTERPOLATOR
114

DIFFERENTIATORS
202

COEFFICIENT MULTIPLIER(S)
204

INTEGRATORS
206

OTHER COMPONENTS
(ADDERS, DELAY ELEMENTS, ETC.)
208

Fig. 2

| Input Sample | Output (606-1) | Output (606-2) | Output (614-1) |
|---|---|---|---|
| X | X | X | 0 |
| Y | Y-X | Y-2X | ΣNX |
| Z | Z-Y | Z-2Y+X | $N^2X+\Sigma N(Y-X)$ |

| Input Sample | Input (608-1) | Output (612-3) (Input (614-2)) | Output (608-1) (Input (614-2)) | Output (614-2) |
|---|---|---|---|---|
| X | X | 0 | X | X |
| | | | 2X | 2X |
| | | | 3X | 3X |
| | | | 4X | 4X |
| | | | ⋮ | ⋮ |
| | | | KX | KX |
| Y | Y-2X | NX | (Y-2X) | (Y-2X)+NX |
| | | | 2(Y-2X) | 2(Y-2X)+NX |
| | | | 3(Y-2X) | 3(Y-2X)+NX |
| | | | 4(Y-2X) | 4(Y-2X)+NX |
| | | | ⋮ | ⋮ |
| | | | K(Y-2X) | K(Y-2X)+NX |
| Z | Z-2Y+X | N(Y-X) | (Z-2Y+X) | (Z-2Y+X)+N(Y-X) |
| | | | 2(Z-2Y+X) | 2(Z-2Y+X)+N(Y-X) |
| | | | 3(Z-2Y+X) | 3(Z-2Y+X)+N(Y-X) |
| | | | 4(Z-2Y+X) | 4(Z-2Y+X)+N(Y-X) |
| | | | ⋮ | ⋮ |
| | | | K(Z-2Y+X) | K(Z-2Y+X)+N(Y-X) |

Fig. 6(c)

| Input Sample | Input (608-2) | Output (608-2) (Input(614-3)) | Output (614-1) (Input(614-3)) | Output (614-3) |
|---|---|---|---|---|
| X | X | X | 0 | X |
| | 2X | (X+2X)=3X | | 3X |
| | 3X | (X+2X+3X)=6X | | 6X |
| | 4X | (X+2X+3X+4X)=10X | | 10X |
| | ⋮ | ⋮ | | ⋮ |
| | KX | ΣKX | | ΣKX |
| Y | (Y-2X)+NX | (Y-2X)+NX | ΣNX | (Y-2X)+NX+ΣNX |
| | 2(Y-2X)+NX | [(Y-2X)+NX]+[2(Y-2X)+NX] = 3(Y-2X)+2NX | | 3(Y-2X)+2NX+ΣNX |
| | 3(Y-2X)+NX | [(Y-2X)+NX]+[2(Y-2X)+NX]+ [3(Y-2X)+NX] = 6(Y-2X)+3NX | | 6(Y-2X)+3NX+ΣNX |
| | 4(Y-2X)+NX | [(Y-2X)+NX]+[2(Y-2X)+NX]+ [3(Y-2X)+NX]+[4(Y-2X)+NX] = 10(Y-2X)+4NX | | 10(Y-2X)+4NX+ΣNX |
| | ⋮ | ⋮ | | ⋮ |
| | K(Y-2X)+NX | ΣK(Y-2X)+KNX | | ΣK(Y-2X)+KNX+ΣNX |
| Z | (Z-2Y+X)+N(Y-X) | (Z-2Y+X)+N(Y-X) | $N^2X$+ΣN(Y-X) | (Z-2Y+X)+N(Y-X)+$N^2X$+ΣN(Y-X) |
| | 2(Z-2Y+X)+N(Y-X) | [(Z-2Y+X)+N(Y-X)]+ [2(Z-2Y+X)+N(Y-X)]= 3(Z-2Y+X)+2N(Y-X) | | 3(Z-2Y+X)+2N(Y-X)+$N^2X$+ΣN(Y-X) |
| | 3(Z-2Y+X)+N(Y-X) | [(Z-2Y+X)+N(Y-X)]+ [2(Z-2Y+X)+N(Y-X)]+ [3(Z-2Y+X)+N(Y-X)]= 6(Z-2Y+X)+3N(Y-X) | | 6(Z-2Y+X)+3N(Y-X)+$N^2X$+ΣN(Y-X) |
| | 4(Z-2Y+X)+N(Y-X) | [(Z-2Y+X)+N(Y-X)]+ [2(Z-2Y+X)+N(Y-X)]+ [3(Z-2Y+X)+N(Y-X)]+ [4(Z-2Y+X)+N(Y-X)]= 10(Z-2Y+X)+4N(Y-X) | | 10(Z-2Y+X)+4N(Y-X)+$N^2X$+ΣN(Y-X) |
| | ⋮ | ⋮ | | ⋮ |
| | K(Z-2Y+X)+N(Y-X) | ΣK(Z-2Y+X)+KN(Y-X) | | ΣK(Z-2Y+X)+KN(Y-X)+$N^2X$+ΣN(Y-X) |

Fig. 6(d)

OFFSET-FREE SINC INTERPOLATOR AND RELATED METHODS

RELATED APPLICATION

The present application claims priority of Indian Patent Application No. 1371/DEL/2009 filed Jul. 3, 2009, which is incorporated herein in its entirety by this reference.

FIELD OF THE INVENTION

The present invention relates conversion of analog signals to digital signals and interpolators for increasing the sampling rate of analog signals to be converted to digital signals using a digital to analog converter. More particularly, the present invention relates to sinc interpolators for converting analog to digital signals and related methods.

BACKGROUND

Generally, an analog signal is used for transferring information and data across a communication channel. The analog signal can be converted into a digital signal at a receiving device such as a mobile phone, laptop, or television. Conversion from an analog to a digital signal is accomplished by sampling the analog signal at predetermined time intervals. Once a digital or discrete signal has been generated, the sampling rate can be increased by interpolation. During interpolation, a set of new data points are constructed within a set of known data points by adding a number of samples between two or more known samples of a discrete-time signal. Generally, interpolation is performed when the digital signal is to be oversampled, for example while reconstructing an analog signal from the digital signal using a digital to analog converter (DAC).

Typically, sinc or cascaded integrator comb (CIC) interpolators are used for oversampling. Sinc interpolators have an ability to handle arbitrary or large sampling rate changes and do not require complex hardware for implementation, thereby facilitating generation of a reliable undistorted analog signal in a DAC. Sinc interpolators include a cascade of differentiators followed by an up-sampler, which is in turn followed by a cascade of integrators.

During operation of a sinc interpolator, an offset can creep into the output generated by the cascade of integrators due to word retention in the integrators. The error due to word retention can get accumulated over a period of time resulting in large errors. Additionally, the output can suffer from quantization errors on account of discrete values being assigned to displaced samples in the digital signal.

Typically, to minimize word retention and quantization errors, the integrators are reset once an offset is detected. Resetting the integrators during operation of the sinc filter can lead to loss of data. Further, most current methods for offset detection and reset apply to first and second order interpolators, which are linear interpolators. Third and higher order interpolators provide for non-linear interpolation of input samples of the analog signal, and an attempt to reset such higher order integrators tends to distort the generated output.

SUMMARY

The subject matter described herein is directed towards system and method for implementing an offset free sinc interpolating filter. In one implementation, an offset free sinc interpolating filter includes differentiators operating at a first sampling frequency, integrators operating at a second sampling frequency, and coefficient multipliers. A coefficient multiplier multiplies a received value with a constant coefficient value. The differentiators, integrators, and coefficient multipliers can be operatively coupled directly to each other and also through other components such as adders and delay elements.

In operation, an input signal is provided to the sinc interpolating filter at the first sampling frequency. The input signal is processed by the differentiators, integrators, and coefficient multipliers to generate an output signal at the second sampling frequency. Once the output signal is generated, the integrators are reset before the next input cycle begins. Thus, as the integrators are reset before each input cycle, offset and quantization errors due to word bit accumulation can be minimized.

These and other features, aspects, and advantages of the present subject matter will be better understood with reference to the following description and appended claims. This summary is provided to introduce concepts related to an offset free sinc interpolating filter, which is further described below in the detailed description. This summary is not intended to identify essential features of the claimed subject matter nor is it intended for use in determining or limiting the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components, as follows:

FIG. 2 is a block diagram of an exemplary offset-free sinc interpolator;

FIGS. 6(b), 6(c), and 6(d) illustrate tables representing analytical equations for the exemplary offset-free third order sinc interpolator.

DETAILED DESCRIPTION OF PREFERRED EMBODIMENTS

Figure 1:
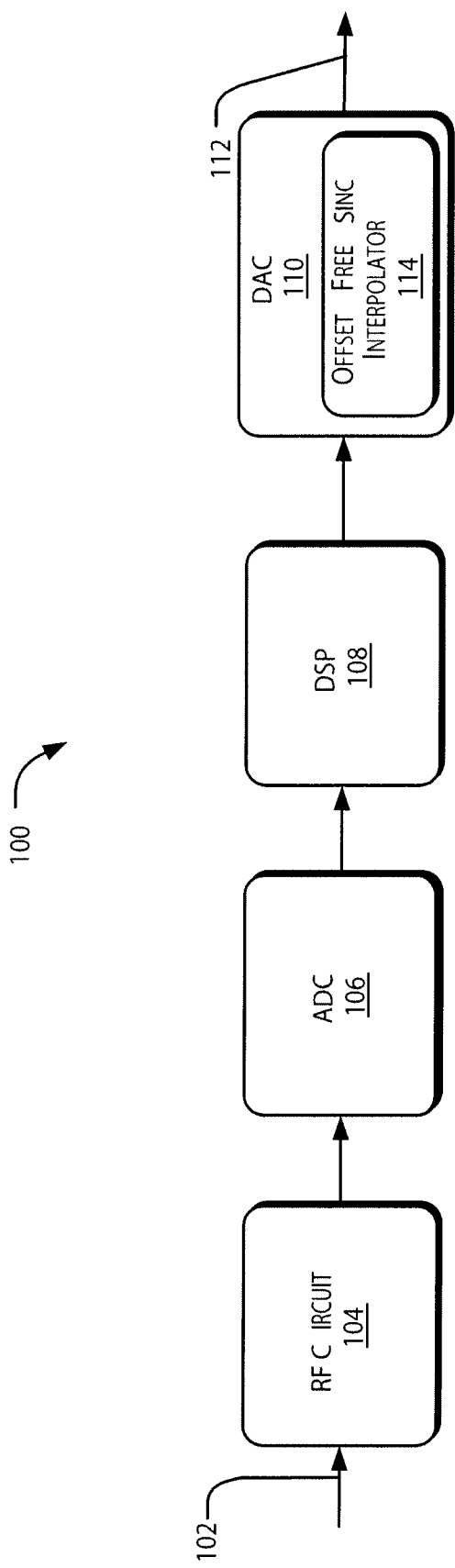
FIG. 1 illustrates an exemplary system implementing an offset-free sinc interpolator.

Cascaded Integrator Comb (CIC) or sinc filters are typically used for interpolation or decimation of discrete-time signals, such as during audio and/or video data processing. Interpolation includes adding a number of samples between two samples of the discrete-time signal, while decimation includes reducing the number of samples in the discrete-time signal. A classical sinc filter of $P^{th}$ order is represented using P stages of differentiators and integrators.

As is generally known, a classical sinc interpolating filter includes a cascade of differentiators, followed by a rate changer and a cascade of integrators. The transfer function of the classical sinc interpolating filter is given by:

$$H(z) = \{(1-z^{-N})/(1-z^{-1})\}^P \qquad (1)$$

The variable N is an integer rate change factor that mainly depends on the desired magnitude of rate change and on the stop band attenuation specification of the filter under consideration. The variable N is usually equal to the interpolation ratio of the sinc filter, also called the degree of the sinc filter. For discussion purposes N will be referred to as the degree of the filter. The variable P is the order of the filter. If the value of P is one, the sinc interpolating filter is a first order filter and includes one stage of a differentiator and one stage of an integrator. If the value of P is two, the sinc interpolating filter is a second order filter and includes two stages of differentiators and two stages of integrators, and so on. Typically, the higher the order of the interpolating filter, better is the quality of the filtered output signal.

However, in case any offsets creep into the integrators due to word retention, such as while using a jittery clock, the offsets get accumulated over time thereby giving erroneous output values. In the generally used implementations of cascaded integrators, the integrators can not be reset to a base value periodically because the integrators are built using filters, such as IIR type filters, that need to retain history of previous outputs. Any periodic reset will reset the memory elements of the filters and produce incorrect outputs.

The described subject matter relates to systems and methods for designing offset-free sinc interpolating filters. It will be understood that interpolating filters have been interchangeably referred to as interpolators hereinafter. An offset-free sinc interpolator includes integrators that can be reset periodically, thereby minimizing offset errors. To design an offset-free sinc interpolator of a given order, the working of a classical sinc filter of the given order can be analyzed to determine analytical equations representing the output generated by the classical CIC filter.

An implementation of the offset-free sinc interpolator, corresponding to the analyzed CIC filter, can be devised from the analytical equations using differentiators, integrators and constant coefficient multipliers. Typically, the differentiators operate at a first sampling frequency of $f_s$. The integrators operate at a second sampling frequency, which is a function of the first sampling frequency, such as $N*f_s$. The integrators can be reset periodically, for example at every $f_s$, thereby making the devised sinc interpolator offset-free. Additionally, the offset-free sinc interpolator can include other elements such as adders and delay elements.

Such offset-free sinc interpolators are not limited to linear interpolation and can be devised for offset-free implementation of sinc filters of any order and degree. Further, these offset-free interpolators can be used in any audio/video processing systems, sigma delta modulators, digital to analog converters, etc.

FIG. 1 illustrates an exemplary system 100 implementing an offset-free sinc interpolator. The order in which the blocks of the system are described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable hardware, software, firmware, or a combination thereof, without departing from the scope of the invention.

The system 100 receives an analog input signal 102 generated by any electronic or communication device such as a mobile phone, a computing system, a personal digital assistant, a broadcasting server, etc. The input signal 102 may include, for example, an audio signal, a video signal, a data signal, etc., and can be received by a radio frequency (RF) circuit 104. The RF circuit 104 processes the input signal 102 to provide a low frequency baseband signal to an analog-to-digital converter (ADC) 106 for digitization The ADC 106 samples the baseband signal at a sampling rate greater than the Nyquist rate to provide a discrete or digital signal. The sampling rate corresponds to the number of samples per second taken from the baseband signal. The digital signal is then processed in a digital signal processor (DSP) 108. The DSP 108 can process the digital signal using a variety of processing techniques known in the art such as filtration, amplification, modulation, etc. to provide a processed digital signal.

The processed digital signal is received by a digital to analog converter (DAC) 110 to generate an analog output signal 112. Due to processing of the input signal 102 by the RF circuit 104, the ADC 106, the DSP 108 and the DAC 110, the output signal 112 is of a quality better than that of the input signal 102. In an implementation, the system 100 can correspond to an audio processing system where the input signal 102 is an audio signal, and the DAC 110 generates an output audio signal 112 for a speaker. In another implementation, the system 100 can correspond to a video or image processing system where the input signal 102 is an image signal and the DAC 110 generates an output image signal 112 for a monitor or screen.

The DAC 110 uses an offset-free sinc interpolator 114 for reconstruction of an analog signal from a digital signal by interpolation. Interpolation refers to the technique of up-sampling of a received digital signal by adding additional samples. The offset-free sinc interpolator 114 is multiplier-free, which accounts for simplified hardware implementation. Also, the offset-free sinc interpolator 114 can handle arbitrary and large sampling rate changes and has high processing speed.

In an implementation, the offset-free sinc interpolator 114 includes multiple differentiators and integrators, and will be described in detail in a later section. The offset-free sinc interpolator 114 can be devised based on empirically determined equations, to enable periodic resetting of the integrators. As the integrators are reset periodically, offset errors are not allowed to accumulate over time, thus minimizing offset and quantization errors.

Though the offset-free sinc interpolator 114 has been shown as a part of the DAC 110 in system 100, it will be understood that the offset-free sinc interpolator 114 can be implemented in other modules, such as a digital signal processing module, a sigma delta modulator, or it can be a stand alone module also.

FIG. 2 illustrates a block diagram of an exemplary offset-free sinc interpolator 114. The offset-free sinc interpolator 114 can be of any desired order P and degree N. In an implementation, the offset-free sinc interpolator 114 receives an input digital signal having a sampling frequency $f_s$ and generates an interpolated output digital signal having a sampling frequency $N*f_s$. For this, the offset-free sinc interpolator 114 includes differentiators 202, coefficient multipliers 204 and integrators 206.

The differentiators 202 operate at the sampling frequency of the input digital signal ($f_s$) and use a delay element to provide an output based on a current input value and a previous input value. The integrators 206 operate at the sampling frequency of the output digital signal (N*$f_s$) and use a delay element to provide an output based on a current input value and a previous output value. The coefficient multipliers 204 multiply a received value with a constant coefficient value. The constant coefficient value is usually a function of the variable N i.e. the rate change factor. The differentiators 202, coefficient multipliers 204 and the integrators 206 are operatively coupled to each other. The differentiators 202, coefficient multipliers 204 and the integrators 206 may be operatively coupled by connecting them directly to each other or through other components 208, such as adders, delay elements, etc, or by a combination of these methods.

In operation, before the first input cycle, all delay elements of the offset-free sinc interpolator 114 are set to a zero value. When the first input cycle begins, an input digital signal is received at a frequency $f_s$ and is processed by the differentiators 202, coefficient multipliers 204 and the integrators 206 to generate an output digital signal at a frequency N*$f_s$.

At the end of the first input cycle, the integrators 206 are reset to a zero value by resetting the delay elements in the integrators 206 to zero. However, other delay elements such as delay elements in the differentiators 202 and other components 208 may not be reset to zero. Thus, any offset errors that may be present in the integrators 206 are eliminated due to resetting and do not get carried over to the next input cycle. This resetting can be carried out at a reset frequency, for example at the end of every input cycle i.e. after every L. As the integrators 206 are reset periodically, offset can be minimized even without intermediate checks for error in output.

In an implementation, the offset-free sinc interpolator 114 of a given order P and degree N can be devised based on analytical equations determined from an analysis of the corresponding classical sinc filter of order P and degree N. The design of the offset-free sinc interpolator 114 is explained in detail below with reference to second and higher order interpolating filters.

As is well known in the art, second order sinc or CIC filters produce linear interpolation. The analytical equations representing the output of second order sinc filters can be intuitively obtained using mathematical principles of linear interpolation. For example, consider a second order $N^{th}$ degree interpolator, which has a transfer function given by:

$$H(z) = \{(1-z^{-N})/(1-z^{-1})\}^2 \quad (2)$$

The second order sinc filter, being a linear interpolator, adds equally spaced samples between two input samples. Consider a first input sample X and a second input sample Y. If the interpolator were to add (N−1) samples between X and Y, it would be equivalent to dividing the distance between X and Y into N equal spaces. Hence, each sample would be equally spaced by ((Y−X)/N). Thus, the $K^{th}$ sample that is added between X and Y would have a value given by:

$$Output(K) = X + K\frac{(Y-X)}{N} = \frac{NX + K(Y-X)}{N} \quad (3)$$

From the above equation, it can be deduced that the numerator of equation (3) can be implemented by an offset-free sinc interpolator 114 using a differentiator 202 that provides the (Y−X) term and an integrator 206, which works at N times the frequency of the differentiator 202, to recursively add the (Y−X) term. Additionally, a constant coefficient multiplier 204 may be used to provide the NX term, which can be added to the integrator output.

At the next input cycle, if Z is given as an input, the differentiator 202 would provide an input (Z−Y) to the integrator 206. The integrator 206 could then start at zero and recursively add the inputs to obtain K(Z−Y) for the $K^{th}$ sample. The constant term, which is NY for the second cycle, is provided by the constant coefficient multiplier 204. Thus, in such a configuration, the integrator 206 need not retain the output value of the previous cycle and can be reset to zero at every input cycle of the differentiator 202, making the second order sinc filter offset-free.

The denominator of equation (3) is a constant and can be compensated for by a gain correction circuit. An implementation of an offset-free second order filter corresponding to equation (3) is shown in FIG. 3.

Figure 3:
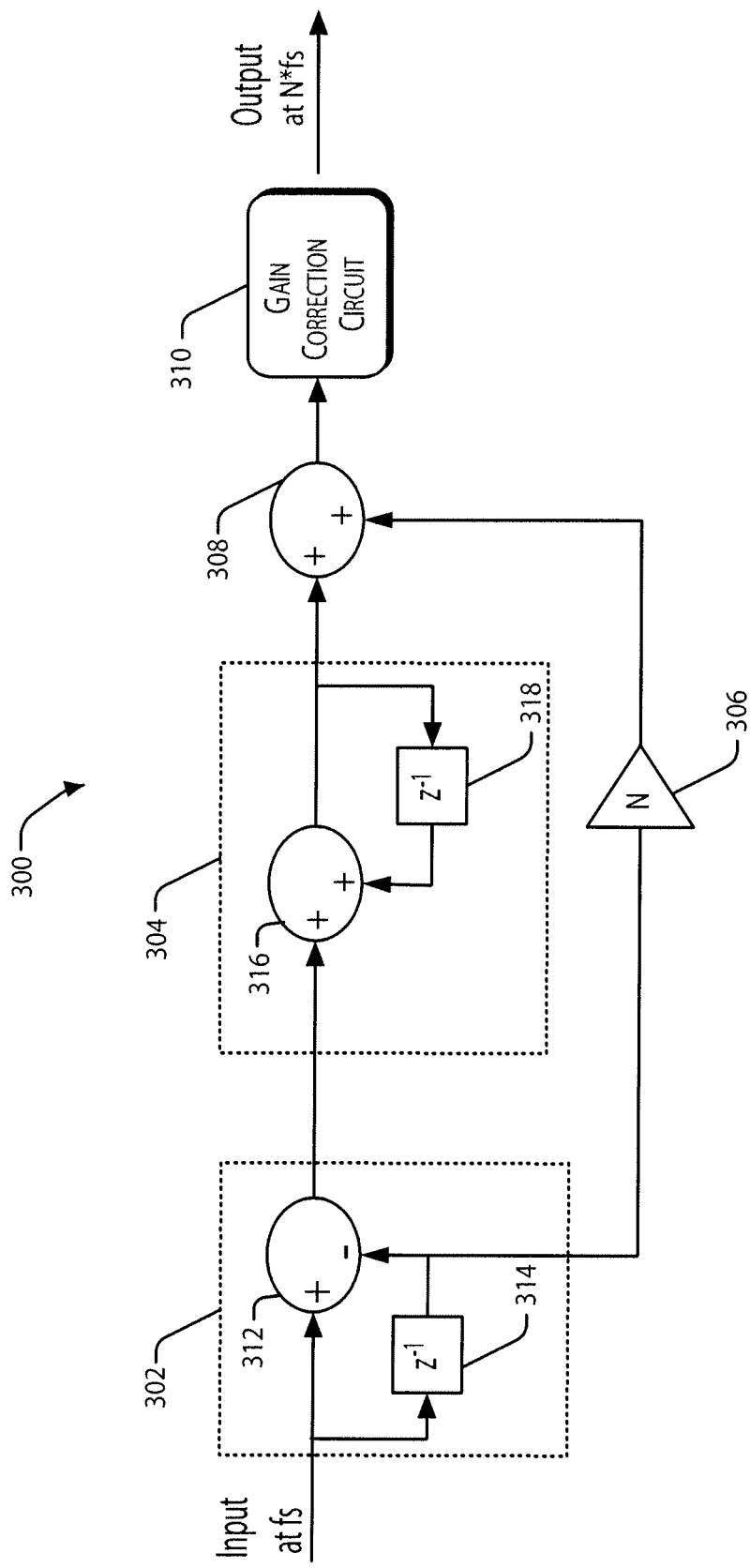
FIG. 3 is a schematic of an offset-free second order sinc interpolator, according to one embodiment.

FIG. 3 is a schematic view of a second order $N^{th}$ degree offset-free sinc interpolator 300. The offset-free sinc interpolator 300 includes a differentiator 302, integrator 304, multiplier 306, adder 308 and gain correction circuit 310. The differentiator 302 includes a subtractor 312 and a delay element 314. The integrator 304 includes an adder 316 and a delay element 318.

In operation, initially, the delay elements 314 and 318 hold zero values. In an implementation, the differentiator 302 operates at a frequency $f_s$ while the integrator 304 operates at a frequency N*$f_s$. Thus for each clock cycle $f_s$ of the differentiator 302, the integrator 304 completes N cycles of a N*$f_s$ clock. The rate change can be achieved by the delay element 314 of the differentiator 302 working as per a $f_s$ clock and the delay element 318 of the integrator 304 working as per a N*$f_s$ clock.

When an input X is provided to the differentiator 302, the output of the differentiator 302 is X, while that of the integrator 304 is X, 2X, 3X . . . NX. At the end of every input cycle, i.e. after every $f_s$, the integrator circuit is re-set and the delay element 318 in the integrator 304 starts at zero for the next cycle. Thus, any offset and quantization errors due to accumulation of word bits gets eliminated.

At the start of the next input cycle, when Y is given as an input, the delay element 314 of the differentiator 302 holds the previous input value X. The output of the differentiator 302 is thus Y−X, which is then fed to the integrator 304. As the delay element 318 of the integrator 304 is reset to 0, the output of the integrator 304 is Y−X, 2*(Y−X), 3*(Y−X), . . . . Further, the output at the delay element 314 is X, which gets multiplied by N at the multiplier 306. The product NX from the multiplier 306 is fed to the adder 308. Thus, the output at the adder 308 is NX+(Y−X), NX+2*(Y−X), NX+3*(Y−X), . . . NX+K(Y−X) . . . , NY. This output is then fed to the gain correction circuit 310 where the output gets divided by a gain correction factor.

The gain correction factor is equal to N as per equation (3). This gain correction factor is comparable to the gain correction factor of a classical sinc filter, where the gain correction factor is given by $N^{(P-1)}$. Since for a second order filter P=2, the gain correction factor for a classical second order sinc filter is also equal to N.

Such an implementation of an offset-free second order interpolating sinc filter is easily realized from an algebraic analysis of the $K^{th}$ sample values because a second order sine filter is a linear interpolator. However, for third and higher order interpolators, which involve polynomial functionalities, such an offset-free implementation can not be directly obtained analytically. This is because equations corresponding to distances between the samples, and equations for the values of the $K^{th}$ sample as given by equation (3) are not known for third and higher order interpolators.

The following description relates to methods and systems for implementing offset-free filters of higher orders i.e. orders greater than 2 as well. It has been found that equation (3), which was algebraically determined by using properties of linear interpolation, can also be determined from an analysis of a classical second order interpolating sinc filter as shown in FIG. 4.

Figure 4:
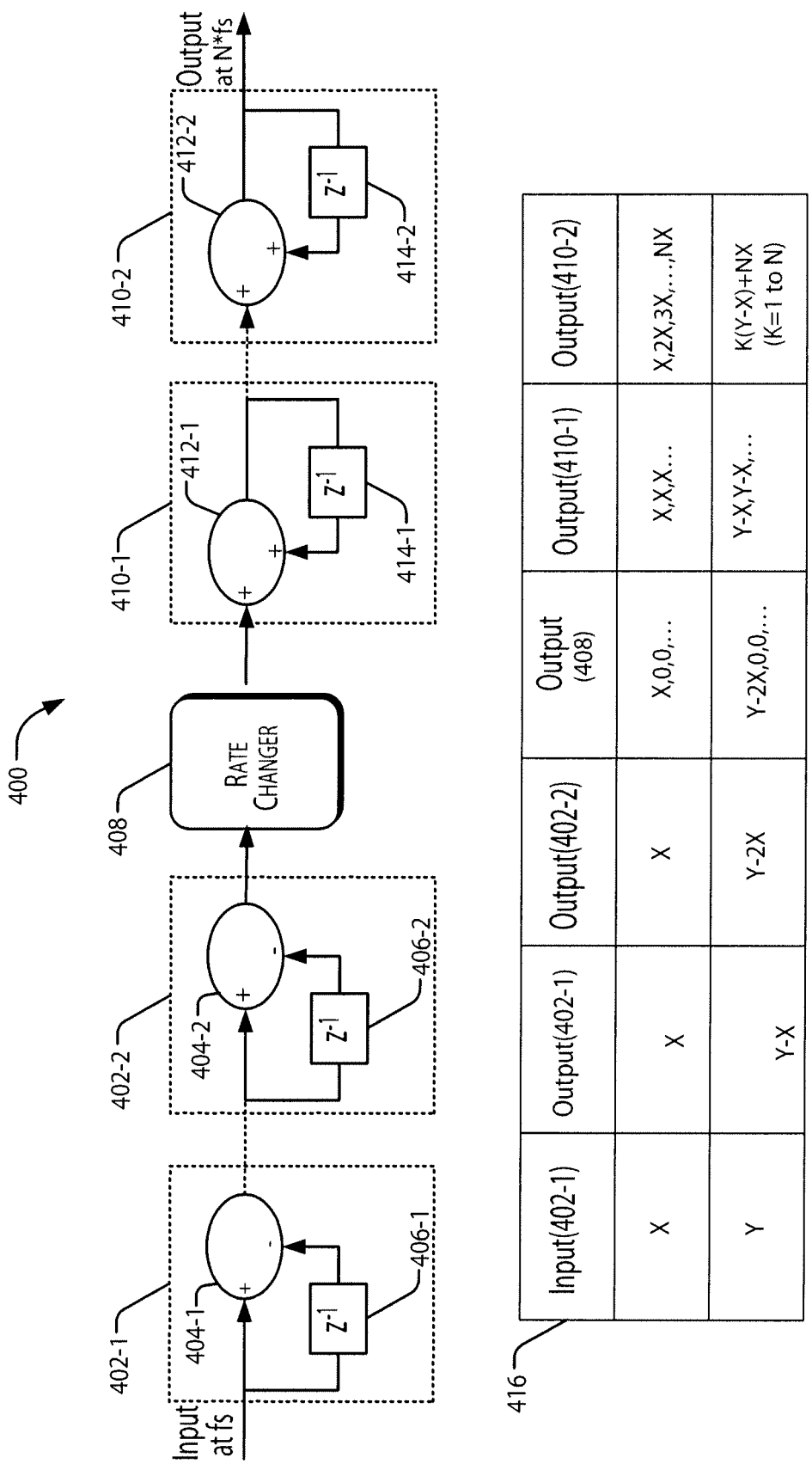
FIG. 4 is a schematic of a classical second order N degree sinc interpolator and corresponding analytical equations determined according to one implementation of the present subject matter.

FIG. 4 illustrates a classical second order N degree sinc filter 400, interchangeably referred to as classical $2^{nd}$ order filter 400, and corresponding analytical equations determined according to one implementation of the present subject matter. The classical $2^{nd}$ order filter 400 includes differentiators 402-1 and 402-2, a rate changer 408 and integrators 410-1 and 410-2. The differentiators 402-1 and 402-2 include subtractors 404-1 and 404-2 respectively and delay elements 406-1 and 406-2 respectively. Likewise, the integrators 410-1 and 410-2 include adders 412-1 and 412-2 respectively and delay elements 414-1 and 414-2 respectively. The outputs generated by the differentiators 402-1 and 402-2, the rate changer 408 and the integrators 410-1 and 410-2 are shown in table 416 and explained below.

In operation, consider an input X is provided at a frequency of $f_s$ to the classical $2^{nd}$ order filter 400. Since at the initial conditions the delay elements 406-1 and 406-2 of the differentiators 402-1 and 402-2 are at zero value, the output at each of the differentiators 402-1 and 402-2 is X. The value X is then sent as an input to the rate changer 408. The rate changer 408 inserts (N−1) zeros and sends X followed by (N−1) zeros to the integrator 410-1 at a frequency of $N*f_s$. It will be understood that the integrators 410 operate at the frequency $N*f_s$, while the differentiators 402 operate at the frequency $f_s$.

The delay elements 414-1 and 414-2 of the integrators 410-1 and 410-2 also start at zero value in the first input cycle. The integrator 410-1 adds X with zeros and gives an output X at frequency $N*f_s$. Thus, the output of the integrator 410-1 is X, X, X . . . , which is then sent to the integrator 410-2. The integrator 410-2 adds the input with the current output to generate an output of X, 2X, 3X . . . NX in one $f_s$ clock cycle. At the end of the first $f_s$ clock cycle, the delay elements 406-1 and 406-2 have the respective previous inputs X stored in them, while the delay elements 414-1 and 414-2 have the respective previous outputs X and NX stored in them.

When the next input, Y, is given to the differentiator 402-1, the output at the differentiator 402-1 is Y−X because the previous input X was stored in the delay element 406-1, which got subtracted from the input Y at subtractor 404-1. The output Y−X is then fed to the next differentiator stage 402-2. Since the delay element 406-2 of the differentiator 402-2 also has X stored in it, the output of the differentiator 402-2 generated by the subtractor 404-2 is Y−2X. The output Y−2X is fed to the rate changer 408 and then the integrator 410-1 as described above.

Since the delay element 414-1 of the integrator 410-1 also has X stored in it, the output of the integrator 410-1 generated by the adder 412-1 is Y−X, Y−X, Y−X . . . at a frequency of $N*f_s$. This output is then fed to the integrator 410-2. Since the delay element 414-2 of the integrator 410-2 has NX stored in it, and the stage operates at a frequency of $N*f_s$, the output of the integrator 410-2 generated by the adder 412-2 is NX+Y−X, NX+2*(Y−X), NX+3*(Y−X), . . . NX+K(Y−X) . . . , NY. This process then repeats for the next input given to the classical $2^{nd}$ order filter 400.

Usually, the output of the classical $2^{nd}$ order filter 400 is followed by a gain correction block as the output has an interpolation gain. The interpolation gain of a $P^{th}$ order $N^{th}$ degree sinc filter is $N^{(P-1)}$. Thus using a gain correction factor of N for P=2, the final $K^{th}$ sample output is [(NX+K(Y−X))/N], which is the same as equation (3).

However, as can be noted, the implementation in FIG. 4 requires the integrators 410-1 and 410-2 to retain the output value of the previous cycle (X and NX from the first cycle), while the integrator 304 of FIG. 3 is not required to retain the output value of the previous cycle. Thus in the implementation of FIG. 4, the integrators 410-1 and 410-2 can lead to accumulated offset errors. On the other hand, the integrator 304 of FIG. 3 can be reset every cycle, making the implementation of FIG. 3 offset-free.

The process as described above for determining an algebraic equation corresponding to the second order $N^{th}$ order classical sinc filter 400 can be followed in case of higher order sinc filters, having multiple stages of differentiators and integrators, to determine corresponding analytical equations. For example, consider the following analysis for a third order classical filter.

Figure 5:
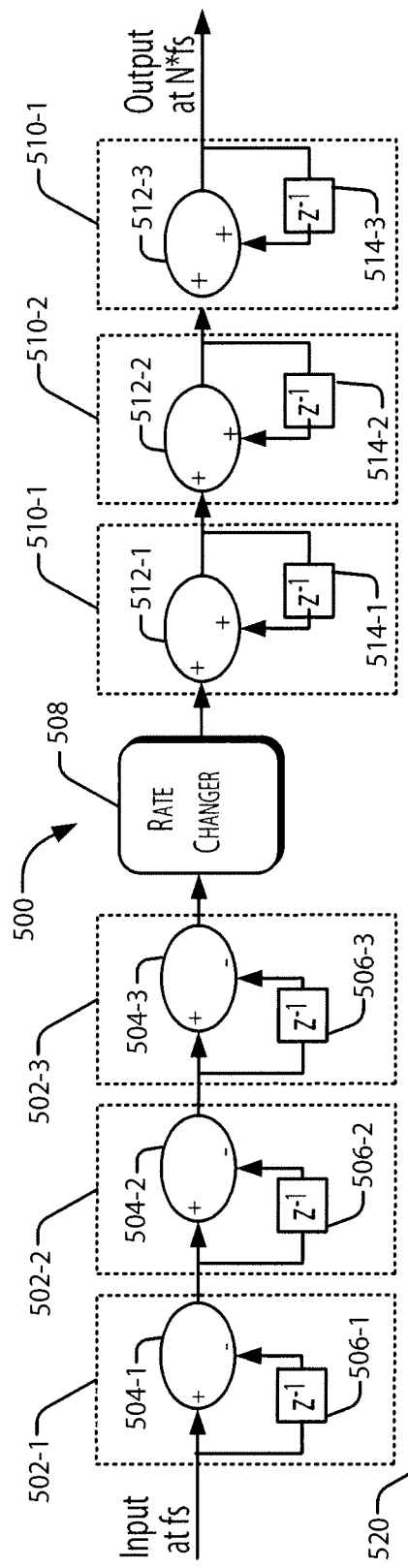
FIG. 5 is a schematic of a classical third order N degree sinc interpolator and corresponding analytical equations determined according to one implementation of the present subject matter.

FIG. 5 is a schematic view of a classical third order and $N^{th}$ degree sinc interpolating filter 500, interchangeably referred to as classical $3^{rd}$ order filter 500, and corresponding analytical equations determined according to one implementation of the present subject matter.

The classical $3^{rd}$ order filter 500 includes three differentiators 502-1, 502-2, and 502-3 collectively referred to as differentiators 502, a rate changer 508 and three integrators 510-1, 510-2, and 510-3 collectively referred to as integrators 510. Each of the differentiators 502 include a corresponding delay element 506-1, 506-2 and 506-3 collectively referred to as delay elements 506; and a corresponding subtractor 504-1, 504-2 and 504-3 collectively referred to as subtractors 504. Likewise, each of the integrators 510 include a corresponding delay element 514-1, 514-2 and 514-3 collectively referred to as delay elements 514; and a corresponding adder 512-1, 512-2 and 512-3 collectively referred to as adders 512.

Since the sinc interpolation filter is an $N^{th}$ degree filter, the rate changer 508 increases the number of samples by inserting N−1 zero-valued samples after each sample in the output obtained from the differentiator 503-3. The input to the differentiators 502 is provided at a sampling frequency $f_s$, and the differentiators 502 operate at that sampling frequency $f_s$. The integrators 510 operate at a frequency $N*f_s$ and the final output provided by the classical $3^{rd}$ order filter 500 is also obtained at the frequency $N*f_s$. The transfer function of the classical $3^{rd}$ order filter 500 is given by the following equation:

$$H(z) = \{(1-z^{-N})/(1-z^{-1})\}^3 \quad (4)$$

The relationship between the output provided by a classical $N^{th}$ order filter and the input(s) given to the classical $N^{th}$ order filter can be determined analytically to implement offset-free sinc filters. For example, on empirically studying the working of the classical $3^{rd}$ order filter 500 using the analytical techniques described herein, it is found that the outputs can be represented as a function of the inputs in the form of algebraic equations. The outputs generated by the differentiators 502, the rate changer 508 and the integrators 510 are shown in table 520 and explained below.

At the initial condition, all delay elements 506 and 514 of the classical $3^{rd}$ order filter 500 are at zero. When an initial input X is provided to the classical $3^{rd}$ order filter 500, the output of all stages of differentiators 502 is X. The rate changer 508 provides an output of X, 0, 0 . . . , thereby changing the sampling frequency from $f_s$ to $N*f_s$. The integrator 510-1 then recursively integrates the current input with the previous output to provide an output X, X, X, . . . . Similarly, the integrator 510-2 provides an output of X, 2X, 3X . . . , KX, . . . , NX and the integrator 510-3 provides an output of X, 3X, 6X, . . . , ΣKX, . . . , ΣNX.

At the end of the first clock cycle $f_s$, the delay elements 506-1, 506-2 and 506-3 in the differentiators 502 have a value X. The delay elements 514-1, 514-2 and 514-3 in the integrators 510 have values X, NX, and ΣNX respectively. Thus, when Y is given as an input to the classical $3^{rd}$ order filter 500 at the next clock cycle, the differentiators 502-1, 502-2 and 502-3 give an output of Y−X, Y−2X, and Y−3X, respectively. The rate changer 508 increases the sampling rate and gives an output of Y−3X, 0, 0, . . . . The integrator 510-1 receives Y−3X, 0, 0, . . . as input and gives outputs of Y−2X, Y−2X, . . . . The integrator 510-2 then gives an output of (Y−2X)+NX, 2(Y−2X)+NX, . . . , K(Y−2X)+NX, . . . , N(Y−2X)+NX, while the integrator 510-3 gives an output of ΣNX+(Y−2X)+NX, ΣNX+3(Y−2X)+2NX, . . . , ΣNX+ΣK(Y−2X)+KNX, . . . , ΣNX+ΣN(Y−2X)+N²X.

At the end of the second clock cycle $f_s$, the delay elements 506-1, 506-2, and 506-3 in the differentiators 502 have a value Y, Y−X and Y−2X, respectively. When the third input Z arrives, then the differentiators 502-1, 502-2 and 502-3 give outputs of Z−Y, Z−2Y+X, and Z−3Y+3X, respectively. The rate changer 508 gives an output of Z−3Y+3X, 0, 0, . . . . The delay elements 514 of the integrators 510 have the outputs of the previous cycle stored in them. So, the delay elements 514-1, 514-2 and 514-3 have values (Y−2X), N(Y−X), and N²X+ΣN(Y−X), respectively. Thus, the integrator 510-1 gives an output of (Z−2Y+X), (Z−2Y+X), . . . and the integrator 510-2 gives an output of (Z−2Y+X)+N(Y−X), 2(Z−2Y+X)+N(Y−X), . . . , K(Z−2Y+X)+N(Y−X), . . . , N(Z−2Y+X)+N(Y−X). Similarly, it can be found that the integrator 510-3 gives a $K^{th}$ sample output of N²X+ΣN(Y−X)+NK(Y−X)+ΣK(Z−2Y+X).

Thus, it can be analyzed that for a third order sinc interpolator, when three inputs, such as X, Y, and Z, are applied in a chronological order to the sinc interpolator, the $K^{th}$ sample obtained at the output of the classical $3^{rd}$ order filter 500 during the interpolation cycle can be represented as:

$$\text{Output}(X) = \Sigma KX \quad (5)$$

$$\text{Output}(Y) = \Sigma NX + KNX + K(Y-2X) \quad (6)$$

$$\text{Output}(Z) = N^2X + \Sigma N(Y-X) + NK(Y-X) + \Sigma K(Z-2Y+X) \quad (7)$$

As will be understood, a third order filter depends on previous two input signal values for computation of the output signal value. Hence, other inputs after Z will generate outputs that conform to a similar function as represented by equation (7) for Z.

The equations (5)-(7) for the $K^{th}$ filter output can be realized by using differentiators and integrators with constant coefficient multipliers, so as to obtain various offset-free configurations. An exemplary offset-free configuration will be explained in detail later with reference to FIG. 6(a)-(d). However, other offset-free configurations may also be realized. Further, it will be appreciated that a similar process can be used to determine an offset-free implementation of other higher order sinc filters.

Figure 6A:
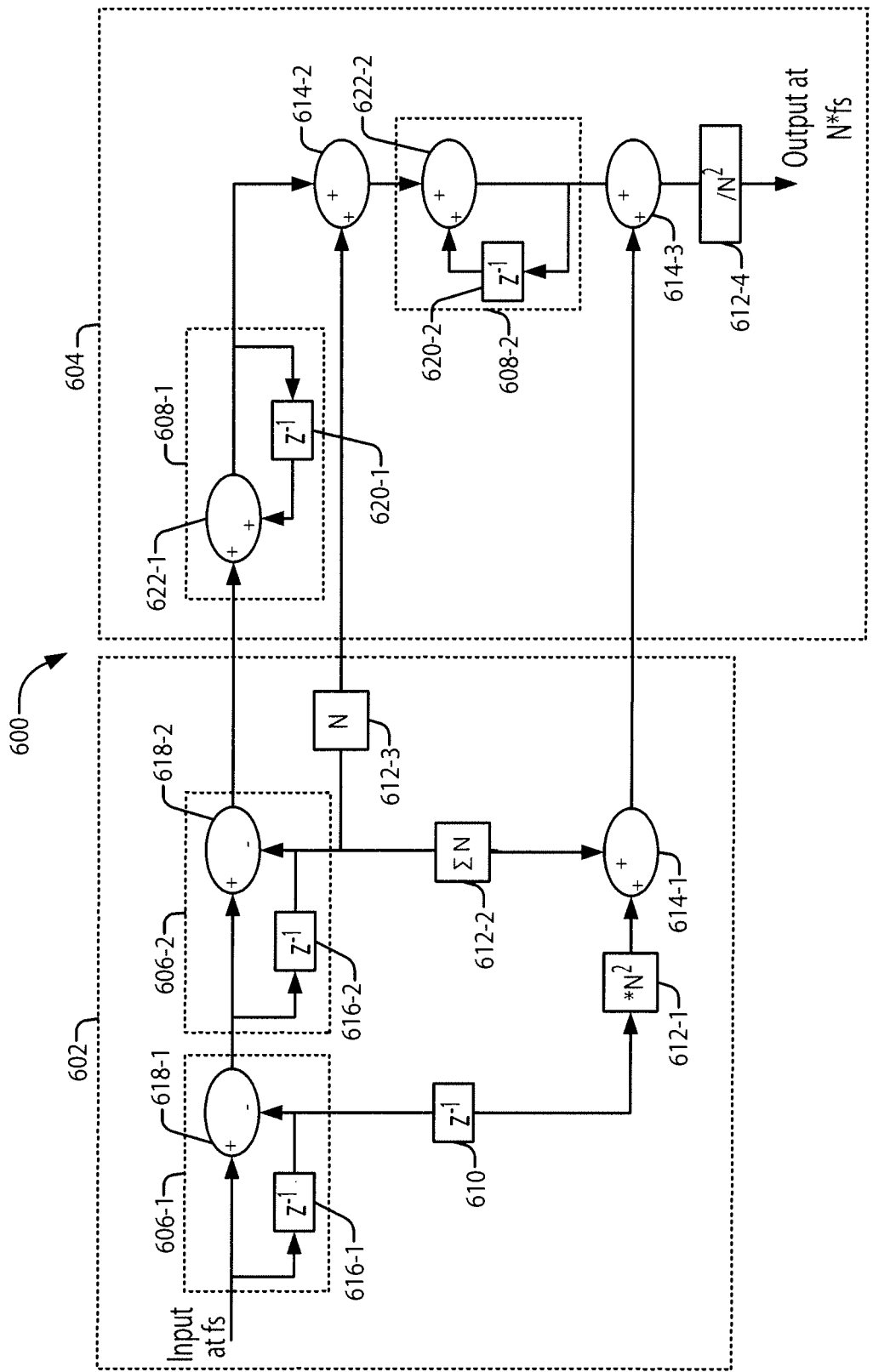
FIG. 6(a) illustrates an exemplary offset-free third order sinc interpolator.

FIG. 6(a) illustrates an exemplary offset-free third order sinc interpolator 600, also referred to as offset-free interpolator 600. For discussion purposes, the offset-free interpolator 600 can be considered as including a first section 602 and a second section 604.

The first section 602 includes differentiators 606-1 and 606-2 a delay element 610, coefficient multipliers 612-1, 612-2 and 612-3, and an adder 614-1. The differentiator 606-1 includes a delay element 616-1 and a subtractor 618-1, and the differentiator 606-2 includes a delay element 616-2 and a subtractor 618-2. The delay elements 616-1 and 616-2 are coupled to the respective subtractors 618-1 and 618-2 through feedback paths.

The delay element 610 receives an input from the delay element 616-1 of the differentiator 606-1 and provides an output to the coefficient multiplier 612-1. In an implementation, the coefficient multiplier 612-1 operates using a coefficient equivalent to the square of N. So, the coefficient multiplier multiplies the output of the delay element 610 with $N^2$ and sends the product to the adder 614-1. The adder 614-1 receives another input from the coefficient multiplier 612-2. In an implementation, the coefficient multiplier 612-2 provides a coefficient having a value equal to the summation of N. So, the coefficient multiplier 612-2 multiplies the output of the delay element 616-2 in the differentiator 606-2 with ΣN and sends the product to the adder 614-1. The delay element 616-2 provides inputs to the coefficient multiplier 612-2 and the coefficient multiplier 612-3. In an implementation, the coefficient multiplier 612-3 generates a coefficient having a value of N. The output from the coefficient multiplier 612-3 is sent to the adder 614-2 of the second section 604.

The second section 604 includes integrators 608-1 and 608-2, a coefficient multiplier 612-4, and adders 614-2, and 614-3. The integrator 608-1 includes a delay element 620-1 and an adder 622-1, and the integrator 608-2 includes a delay element 620-2 and an adder 622-2. The delay elements 620-1 and 620-2 are coupled to the respective adders 622-1 and 622-2 through feedback paths.

The adder 614-2 receives inputs from the coefficient multiplier 612-3 of the first section 602 and the integrator 608-1, and sends an output to the adder 622-2 of the integrator 608-2. The output from the integrator 608-2 is sent to the adder 614-3. The adder 614-3 receives another input from the adder 614-1 of the first section 602. The output from the adder 614-3 is gain corrected by the coefficient multiplier 612-4 to generate the final output of the offset-free interpolator 600. In an implementation, the coefficient multiplier 612-4 generates a coefficient having a value which is the reciprocal of the square of N to correct the output generated by the adder 614-3.

In operation, the differentiators 606-1 and 606-2, collectively referred to as differentiators 606, operate at a first sampling frequency $f_s$. The integrators 608-1 and 608-2, collectively referred to as integrators 608, operate at a second sampling frequency, which is a multiple of the first sampling frequency, for example $N*f_s$, where N is the degree of the offset-free interpolator 600. Further, the integrators 608 are reset after every N cycles of $N*f_s$, or once every $f_s$ cycle, so that an offset due to retention of a value in the delay elements 616-1 and 616-2 is eliminated.

As will be explained in detail later, the implementation of the offset-free interpolator 600 provides the required output as represented by equations (5)-(7) mentioned above, using components such as the differentiators 606, the integrators 608 and the constant coefficient multipliers 612. Additionally, other components such as the adders 614 and the delay element 610 can be used to connect the aforementioned components. Similar implementations can be devised for higher order filters also.

The above implementation serves to minimize quantization errors that can occur in the integrators of classical sinc interpolators. Further, in a dynamic scenario, where intermittent bursts of intelligible signals may be processed by the sinc filter, errors due to the inherent discontinuity introduced by such a semi-dormant system are also minimized.

For example, in case of a mobile phone receiving an incoming call, a radio frequency (RF) circuit of the mobile phone receives RF signals at a receiver's end. These RF signals are processed by the RF circuit to provide an analog baseband signal, which can be applied to an analog-to-digital converter (ADC). The ADC samples the analog baseband signal and provides a digital baseband signal having a number of samples of the analog baseband signal. The digital baseband signal can be applied to a sinc interpolator, preferably a high order sinc interpolator.

The high order sinc interpolator, having a differentiator section followed by an integrator section, up-samples the received digital baseband signal to efficiently reconstruct the required analog signal for use by the mobile phone. During this up-sampling, a value of the output digital sample is retained in the integrator section. Subsequently, after the call has ended, the RF circuit, the ADC, and the DAC turn dormant momentarily.

In case the mobile phone receives another incoming call within a short duration, the retained value of the previous samples can interfere with reliable interpolation of the currently received digital signal and can introduce quantization errors in the analog baseband signal finally obtained from the DAC.

However, if an offset-free interpolator, for example, the offset-free sinc interpolator 600, is used in a digital-to-analog converter (DAC), the integrators, for example, the integrators 608, can be reset periodically. Thus, the sinc interpolator 600 minimizes the errors introduced due to inherent discontinuity introduced by a semi-dormant system, such as the mobile phone in the above mentioned case. In addition to the robustness against quantization error, any overflow error that might eventually arise due to finite precision effects of integrators is minimized by the inherent periodic resetting of the integrators 608 in the offset-free interpolator 600.

FIGS. 6(b), 6(c), and 6(d) illustrate tables 624, 626, and 628 respectively, representing various input cycles and output values generated during the operation of the offset-free interpolator 600 of FIG. 6(a) to provide equations (5)-(7) mentioned above for input samples X, Y, and Z.

The table 624 in FIG. 6(b) illustrates outputs from the first section 602, particularly outputs of the differentiators 606 and the adder 614-1 for input samples X, Y, and Z. Initially, the delay elements 610, 616-1, and 616-2 are set at zero and hold no value, when a first input sample X is applied to the offset-free interpolator 600. The outputs of the differentiators 606-1 and 606-2 are therefore X and X. On the other hand, the adder 614-1 provides an output of zero value.

At the end of the first input cycle, when a second input sample Y is applied to the offset-free interpolator 600, the delay elements 616-1 and 616-2 hold the value X, while the delay element 610 holds the value zero. Accordingly, for the second input sample Y, the differentiators 606-1 and 606-2 provide outputs of Y−X and Y−2X, while the adder 614-1 provides an output of $\Sigma NX$. Subsequently, at the end of the second input cycle, values stored in the delay elements 616-1, 616-2, and 610 change to Y, Y−X, and X. Thus, when a third input sample Z is applied to the offset-free interpolator 600, the outputs obtained from the differentiators 606-1 and 606-2 are Z−Y and Z−2Y+X, while the adder 614-1 provides $N^2X+\Sigma N(Y-X)$ as the output.

In each input cycle, the outputs of the differentiator 606-2, the adder 614-1, and the coefficient multiplier 612-3 are applied to the second section 604 of the offset-free interpolator 600. As the value stored in the delay element 616-2 of the differentiator 606-2 changes in each input cycle, the output of the coefficient multiplier 612-3 also changes accordingly.

The table 626 in FIG. 6(c) illustrates inputs provided to and outputs generated from the integrator 608-1 and the adder 614-2 for the above mentioned input cycles. The integrator 608-1 receives its input from the differentiator 606-2. Since the integrator 608-1 operates at the second sampling frequency, $N*f_s$, the integrator 608-1 provides N output samples for each of the input samples X, Y, and Z. The adder 614-2 receives its inputs from the integrator 608-1 and the coefficient multiplier 612-3. The table 626 illustrates the $K^{th}$ sample outputs of the integrator 608-1 and the adder 614-2 for each input cycle.

In an implementation, when the first input sample X is applied to the offset-free interpolator 600, the differentiator 606-2 provides an output X, which is sent to the integrator 608-1 as input. The integrator 608-1 recursively integrates the received input N times to provide an output of X, 2X, 3X, 4X . . . , NX. Therefore, the $K^{th}$ sample output of the integrator 608-1 can be represented as KX. The adder 614-2 adds the output of the integrator 608-1 to the output of the coefficient multiplier 612-3. In the first input cycle, the coefficient multiplier 612-3 gives a zero value output and, accordingly, the $K^{th}$ sample output of the adder 614-2 is also KX.

As discussed earlier, the delay element 620-1 of the integrator 608-1 is reset to zero before application of the next input sample, for example the second input sample Y, to the offset-free interpolator 600. Therefore, when the second input sample Y is applied, the integrator 606-2 receives an input Y−2X from the differentiator 606-2 and provide outputs Y−2X, 2(Y−2X), 3(Y−2X), 4(Y−2X), . . . , N(Y−2X). Thus the $K^{th}$ sample output of the integrator 608-1 can be represented as K(Y−2X), which is sent to the adder 614-2 as input. The adder 614-2 also receives NX as input from the coefficient multiplier 612-3 and generates K(Y−2X)+NX as the output.

Similarly, when the third input sample Z is applied to the offset-free interpolator 600, the integrator 608-1 receives Z−2Y+X as input from the differentiator 606-2 and provides Z−2Y+X, 2(Z−2Y+X), 3(Z−2Y+X), 4(Z−2Y+X), . . . , N(Z−2Y+X) as output. Thus, the $K^{th}$ sample output of the integrator 608-1 can be represented as K(Z−2Y+X). In addition to the output from the integrator 608-1, the adder 614-2 receives N(Y−X) as input from the coefficient multiplier 612-3. Accordingly, the adder 614-2 generates K(Z−2Y+X)+N(Y−X) as an output in the third input cycle.

The table 628 illustrates inputs provided to and outputs generated from the integrator 608-2 and the adder 614-3. The integrator 608-2 receives its input from the adder 614-2. The integrator 608-2 also operates at the second sampling frequency, $N*f_s$ to provide N output samples. The adder 614-3 receives its inputs from the integrator 608-2 and the adder 614-1. The table 628 illustrates the $K^{th}$ sample outputs of the integrator 608-2 and the adder 614-3 for each input cycle of the offset-free interpolator 600.

When the first input sample X is applied to the offset-free interpolator 600, the integrator 608-2 receives X, 2X, 3X, . . . , KX as inputs from the adder 614-2 and provides $\Sigma KX$ as the $K^{th}$ sample output. The adder 614-3 receives zero valued sample as input from the adder 614-1 in addition to the output of the integrator 608-2 and correspondingly provides $\Sigma KX$ as the $K^{th}$ sample output. It can be noted that this output of the adder 614-3 corresponds to equation (5), i.e. the analyzed output of the classical $3^{rd}$ order interpolator 500 for the first input sample X.

As discussed, prior to application of the next input sample, for example the second input sample Y, to the offset-free interpolator 600, the delay element 620-2 of the integrator 608-2 is reset. Therefore, for the second input sample Y, the integrator 608-2 receives K(Y−2X)+NX as the $K^{th}$ sample input from the adder 614-2 and provides $\Sigma K(Y-2X)+KNX$ as the $K^{th}$ sample output. The corresponding output of the adder 614-3 can be represented as $\Sigma K(Y-2X)+KNX+\Sigma NX$ as the adder 614-3 additionally receives $\Sigma NX$ as an input from the adder 614-1. It can be noted that this output of the adder 614-3 corresponds to equation (6), i.e. the analyzed output of the classical $3^{rd}$ order interpolator 500 for the second input sample Y.

Similarly, the delay element 620-2 of the integrator 608-2 is again reset before application of the next input sample, for example the third input sample Z, to the offset-free interpolator 600. Therefore, for the $K^{th}$ sample input $\Sigma K(Z-2Y+X)+KN(Y-X)$, the integrator 608-2 provides as $\Sigma K(Z-2Y+X)+KN(Y-X)$ the output. The corresponding output of the adder 614-3 can be represented as $\Sigma K(Z-2Y+X)+KN(Y-X)+N^2X+\Sigma N(Y-X)$ as the adder 614-3 additionally receives $N^2X+\Sigma N(Y-X)$ as input from the adder 614-1. It can be noted that this output of the adder 614-3 corresponds to equation (7), i.e. the analyzed output of the classical $3^{rd}$ order interpolator 500 for the third input sample X.

Therefore, the offset-free third order sinc interpolator 600, which is based on the equations (5)-(7) mentioned above, provides for an implementation of a third order sinc interpolator in which the integrators can be reset periodically.

The gain of the outputs generated by the adder 614-3 can be adjusted using a gain correction coefficient provided by the coefficient multiplier 612-4 to provide gain corrected outputs. The gain correction coefficient is comparable to the gain correction factor of a classical sinc filter, where the gain correction factor is given by $N^{(P-1)}$. For example, the gain correction factor for a third order sinc interpolator is $N^2$. Accordingly, the output of the adder 614-3 can be multiplied by a coefficient equivalent to $1/N^2$ provided by the coefficient multiplier 612-4.

It will be noted that other implementations of offset-free sinc interpolators corresponding to equations (5)-(7) may also be devised in which the integrators may be periodically reset, for example at every input cycle, to minimize offset accumulation. Similarly, offset-free implementations of sinc interpolators of any given order P and degree N may be devised using the described techniques.

Figure 7:
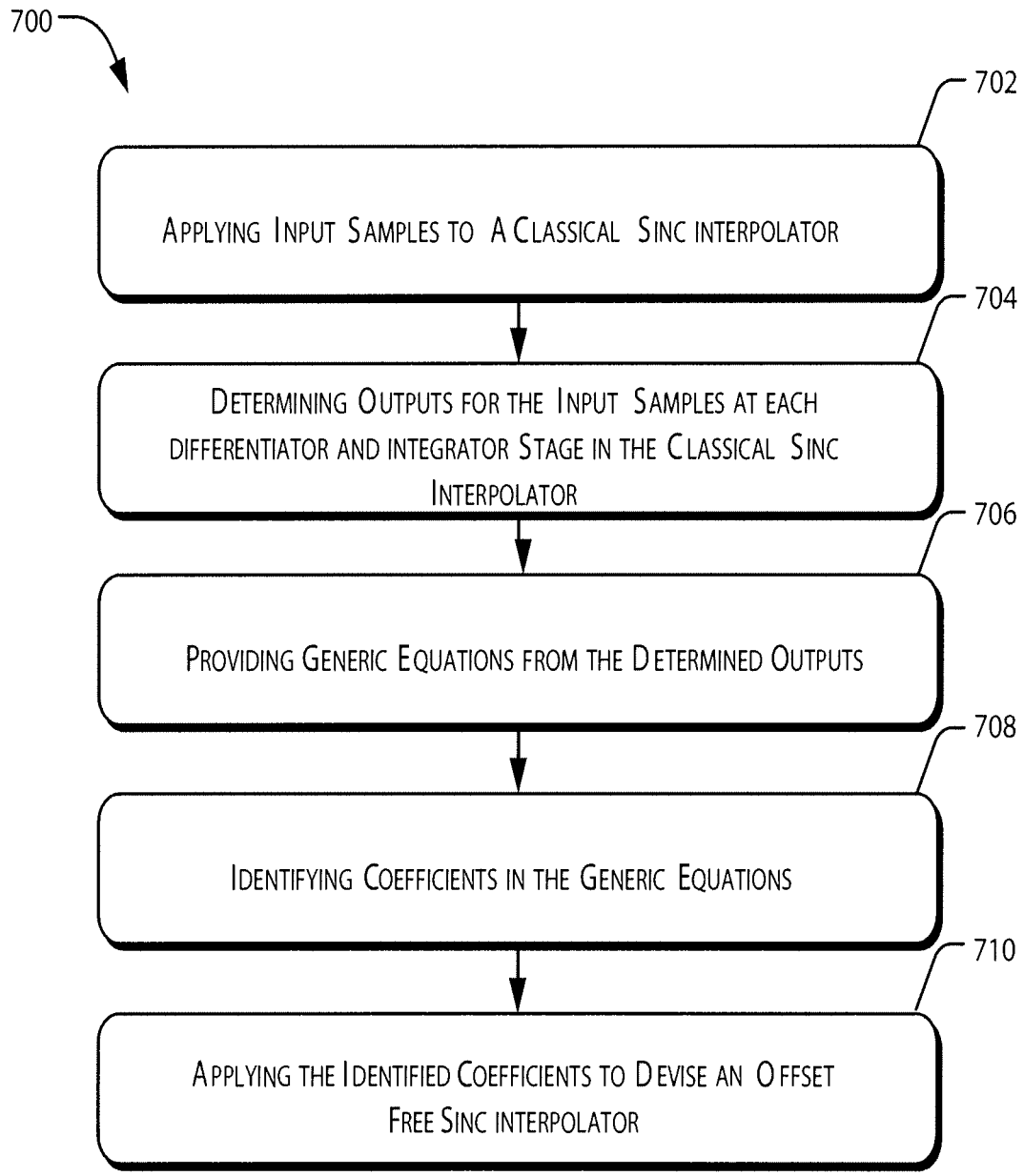
FIG. 7 illustrates an exemplary method for devising an off-set free sinc interpolator.

FIG. 7 illustrates an exemplary method 700 for devising an off-set free sinc interpolator. The exemplary method may be described in the general context of computer executable instructions. Generally, computer executable instructions can include routines, programs, objects, components, data structures, procedures, modules, functions, and the like that perform particular functions or implement particular abstract data types.

The order in which the method 700 is described is not intended to be construed as a limitation, and any number of the described method blocks can be combined in any order to implement the method, or an alternate method. Additionally, individual blocks may be deleted from the method without departing from the spirit and scope of the subject matter described herein.

At block 702, input variables are applied to a classical sinc interpolator of the same order as the offset-free interpolator to be devised. For example, to devise the third order offset-free interpolator 600, input variables are applied to the classical $3^{rd}$ order sinc interpolator 500. In an implementation, the number of inputs applied to the classical sinc interpolator is equal to the order of the interpolator. For example, three inputs X, Y and Z may be applied to the classical $3^{rd}$ order sinc interpolator 500.

At block 704, outputs at each differentiator and integrator stage of the classical sinc interpolator are determined for the applied inputs. Further, the final outputs corresponding to each applied input are also determined analytically for the classical sinc interpolator, e.g., as shown in table 520.

At block 706, generic equations are provided for the final outputs from the classical sinc interpolator. In an implementation, the generic equations are provided for the $K^{th}$ sample of the final outputs for each input. For example, equation (5) can be provided for the first input sample X based on an analysis of the outputs of each integrator and differentiator stage of the classical $3^{rd}$ order sinc interpolator 500. Similarly, equations (6) and (7) can also be provided for the second and third input samples Y and Z. The generic equations may be provided by a program module or by a user through a user interface.

At block 708, coefficients in the generic equations are identified. In an implementation, the coefficients correspond to constant values, which are a function of the degree of the classical sinc interpolator. For example, it can be seen that the equation (5) includes a coefficient $\Sigma N$, equation (6) includes coefficients $\Sigma N$ and N, while equation (7) includes coefficients $\Sigma N$, N and $N^2$.

At block 710, the identified coefficients are applied along with differentiators, integrators, constant coefficient multipliers and other components to devise an offset-free sinc interpolator in which the integrators can be periodically reset. The other components can include adders, subtractors, delay elements, etc. For example, the offset-free interpolator 600 may be devised using constant coefficient multipliers 612 along with differentiators 606, integrators 608, adders 614 and a delay element 610.

The method 700 may be executed by any system including a processor and a memory, the memory having the computer executable instructions for executing the method. For example the system may be a computing system used for designing sinc interpolators. Furthermore, the method 700 can be implemented in any suitable hardware, software, firmware, or combination thereof. The computer executable instructions, in whole or in part, may also be stored on a computer readable medium separated from the system on which the instructions are executed. The computer readable medium may include any volatile or non-volatile storage medium such as flash memory, compact disc memory, and the like.

In one exemplary system, a computer-implemented method includes the steps of receiving a plurality of input variables, applying the plurality of input variables to a classical sinc interpolator implementation comprising multiple stages of differentiators and integrators, measuring outputs for each of the input variables at each of the multiple stages of differentiators and integrators in the classical sinc interpolator implementation, identifying coefficients associated with the measured outputs, and devising a sinc interpolator by applying the identified coefficients, said interpolator having periodically resettable integrators making the interpolator offset-free.

Although embodiments for an offset-free sinc interpolator have been described in language specific to structural features and/or methods, it is to be understood that the appended claims are not necessarily limited to the specific features or methods described. Rather, the specific features and methods are disclosed as exemplary implementations for the sinc interpolator.

The invention claimed is:

1. A sinc interpolating filter comprising:
    differentiators operating at a first sampling frequency;
    integrators operating at a second sampling frequency, wherein the integrators are reset periodically; and
    at least one coefficient multiplier operatively coupled to the differentiators and the integrators, wherein the coefficient multiplier multiplies an input value received by the coefficient multiplier with a constant coefficient value, wherein the differentiators are coupled to the integrators directly through a first path, and wherein the differentiators are coupled to an intermediate node of the integrators through a coefficient multiplier and to an output of the integrators via first and second adders through a second path.

2. The sinc interpolating filter of claim 1, wherein the integrators are reset at a frequency equal to the first sampling frequency.

3. The sinc interpolating filter of claim 1, wherein the integrators are reset at each input cycle of the sinc interpolating filter.

4. The sinc interpolating filter of claim 1, wherein the second sampling frequency is a multiple of the first sampling frequency.

5. The sinc interpolating filter of claim 1 comprising at least one adder to operatively couple the coefficient multiplier, the differentiators and the integrators.

6. The sinc interpolating filter of claim 1 comprising at least one delay element to operatively couple the coefficient multiplier, the differentiators and the integrators.

7. The sinc interpolating filter of claim 1, wherein the constant coefficient value is a function of a ratio of the second sampling frequency to the first sampling frequency.

8. The sinc interpolating filter of claim 1, wherein each of the differentiators includes a subtractor and a delay element to generate a differentiated output.

9. The sinc interpolating filter of claim 1, wherein each of the integrators includes an adder and a delay element to generate an integrated output.

10. A system comprising:
a digital signal processor that provides a digital signal as output; and
a sinc interpolating filter to oversample the digital signal, the sinc interpolating filter comprising:
differentiators operating at a first sampling frequency; and
integrators operating at a second sampling frequency, the integrators being operatively coupled to the differentiators, wherein the integrators are reset at a reset frequency that is a function of the first sampling frequency,
wherein the differentiators are coupled to the integrators directly through a first path, and wherein the differentiators are coupled to an intermediate node of the integrators through a coefficient multiplier and to an output of the integrators via first and second adders through a second path.

11. The system of claim 10, wherein the sinc interpolating filter further comprises at least one coefficient multiplier operatively coupled to the differentiators and the integrators, wherein the coefficient multiplier multiplies an input value received by the coefficient multiplier with a constant coefficient value.

12. The system of claim 11, wherein the sinc interpolating filter further comprises at least one adder to operatively couple the coefficient multiplier, the differentiators and the integrators.

13. The system of claim 11, wherein the constant coefficient value is a function of a ratio of the second sampling frequency to the first sampling frequency.

14. The system of claim 10, wherein the reset frequency is equal to the first sampling frequency.

15. A method comprising:
receiving an input signal at a first sampling frequency;
processing the input signal using differentiators, integrators, and at least one coefficient multiplier, to generate an output signal at a second sampling frequency;
resetting the integrators on generation of the output signal and before receipt of a next input signal;
coupling the differentiators to the integrators directly through a first path; and
coupling the differentiators to an intermediate node of the integrators through a coefficient multiplier and to an output of the integrators via first and second adders through a second path.

16. The method of claim 15, wherein the resetting the integrators comprises resetting delay elements in the integrators.

17. The method of claim 15, wherein the processing the input signal using at least one coefficient multiplier includes multiplying a constant coefficient value with a value that is input to the coefficient multiplier.

18. A computer-implemented method comprising:
applying input variables to a classical sinc interpolator implementation comprising multiple stages of differentiators and integrators;
determining outputs for each of the input variables at each of the multiple stages of differentiators and integrators in the classical sinc interpolator implementation;
identifying coefficients associated with the outputs;
applying the identified coefficients to devise a sinc interpolator with periodically resettable integrators;
coupling the differentiators to the integrators directly through a first path; and
coupling the differentiators to an intermediate node of the integrators through a coefficient multiplier and to an output of the integrators via first and second adders through a second path.

19. The computer-implemented method of claim 18 further comprising providing one or more equations to characterize the outputs for each of the input variables.

20. The computer-implemented method of claim 19, wherein the coefficients are identified from the one or more equations.

* * * * *